United States Patent [19]
Komarek et al.

[11] Patent Number: 5,581,203
[45] Date of Patent: Dec. 3, 1996

[54] SEMICONDUCTOR READ-ONLY VLSI MEMORY

[75] Inventors: James A. Komarek, Balboa Beach; Scott B. Tanner, Irvine; Clarence W. Padgett, Westminster; Jack L. Minney, Irvine, all of Calif.

[73] Assignee: Creative Integrated Systems, Inc., Santa Ana, Calif.

[21] Appl. No.: 435,151

[22] Filed: May 5, 1995

Related U.S. Application Data

[62] Division of Ser. No. 71,892, Jun. 3, 1993, Pat. No. 5,414,663, which is a division of Ser. No. 912,112, Jun. 6, 1992, Pat. No. 5,241,497, which is a division of Ser. No. 538,185, Jun. 14, 1990, abandoned.

[51] Int. Cl.$^6$ .................................................. H03H 11/16
[52] U.S. Cl. .............................. 327/3; 327/252; 327/530
[58] Field of Search ............................... 327/3, 161, 252, 327/276, 278, 31, 37, 156, 159, 362, 545

[56] References Cited

U.S. PATENT DOCUMENTS 4,338,569  7/1982  Petrich .
5,073,886  12/1991  Sasaki et al. ............................... 369/60
5,295,164  3/1994  Yamamura ............................... 375/120
5,336,940  8/1994  Sorrells et al. .
5,345,119  9/1994  Khoury .
5,351,000  8/1994  Farwell ............................... 324/76.77

Primary Examiner—Timothy P. Callahan
Assistant Examiner—Jung Ho Kim
Attorney, Agent, or Firm—Daniel L. Dawes

[57] ABSTRACT

The performance of a very large scale integrated READ ONLY MEMORY circuit is improved by improvements in various circuits and methodologies utilized in the memory. Appropriate bias levels are generated by a bias circuit for use in the output buffer according to whether a process temperature and voltage variations within the memory circuit are such that variation sensitive components will be slowed upon the occurrence of such variations. The bias circuit otherwise generates a bias signal appropriate for fast speed operations within the output buffer circuit when process temperature and voltage variations are such that they do not effect circuit speed of sensitive circuit portions. The back bias generator which operates asynchronously from the memory cycle is improved by disabling the charge pumping action during a memory cycle.

9 Claims, 8 Drawing Sheets

SEMICONDUCTOR READ-ONLY VLSI MEMORY

The present application is a divisional of patent application Ser. No. 08/071,892, filed Jun. 3, 1993 now issued as U.S. Pat. No. 5,414,663, which was a divisional of patent application Ser. No. 07/912,112, filed Jun. 6, 1992 now issued as U.S. Pat. No. 5,241,497, which in turn was a divisional patent application Ser. No. 07/538,185, filed Jun. 14, 1990 now abandoned, each of which patent applications are incorporated herein by reference.

BACKGROUND OF THE INVENTION

1. Field of the Invention

The present invention relates to a read only memory (ROM), and in particular to improvements in the circuitry and methodology of the subcircuits included within a very large scale integrated (VLSI) ROM.

2. Description of the Prior Art

As shown in FIG. 1, the overall structure of a prior art ROM is typically comprised of an input buffer circuit, an address transition detector circuit (ATD), an X and Y decoder circuit, a sense amplifier for reading the memory cells. A plurality of memory cells coupled to the input buffer and accessed through the X and Y decoder with their output completed to the sense amplifier, and an output buffer circuit having its input coupled to the output of the sense amplifier. The function of the input buffer is to convert a TTL level signal into a voltage level compatible with the ROM when an address signal is received at the ATD circuit. The function of the address transition detector circuit is to detect address transitions from the output of the input buffer in order to generate appropriate timing signals within the ROM. The X and Y decoders decode an address to select a predetermined memory cell within the array. The sense amplifier reads the data stored in the memory cell. The output from the sense amplifier is then buffered to the output circuit for a TTL level output. Such prior art architectures are prone to several limitations as discussed below.

Prior art output buffer circuits have experienced slow switching speeds in the NMOS output transistors. For example, as described in the IEEE Journal of Solid State Circuits, Vol. 23, No. 5, 1988 at pages 1054 1058, an output buffer circuit suppresses the peak of current flowing from an output pin by temporarily setting its output at an intermediate potential between the high and low logic levels. However, since the output is temporarily set at an intermediate potential, current flows through the output circuitry if a CMOS device is provided as the input of the next stage. In the circuit described in the 1988 IEEE Solid State Circuits Conference Digest of Technical Papers, pages 120–121, a bias signal is applied to an NMOS transistor in the final inverter stage of the output buffer circuit through a coupling transistor. The bias voltage is applied to a coupling transistor. Since the bias voltage is fixed between zero volts and the supply voltage, the switching speed of the final stage, NMOS transistor is increased. The increase in switching speed is utilized to suppress the peak current which flows from the output pin to ground when the output level switches from a high to a low logic level. However, since the switching rate of the NMOS transistor is increased, excessive time is required to convert the output to a high output level.

Among the efforts currently being made in the art to produce larger and denser semiconductor devices, is the use of dynamic circuits for constructing larger scale and faster memories. However, a conventional dynamic circuit has a data hold period in the buffer, that is, the period during which data must be held regardless of the circuit's gated diffusion capacity. Therefore, due to pattern layout architecture, performance during hold periods may be erratic. If the signal is affected by coupling noise input through a gate, the transistor may enter a half-on state, if not malfunctioning altogether, because the gate voltage is floating and not driven. This in turn leads to the emission of hot electrons. Hot electrons can affect the reliability of the array and can be substantial where the circuit is highly miniaturized. Therefore, what is needed is a dynamic circuit which is not affected by these coupling noises.

Refer briefly to FIG. 25 which shows a prior art circuit used to deal with noise in an output buffer. Noise is reduced by applying an intermediate voltage or bias to the gate of a transistor 350 when the input signal, IN, changes from the logic low to the logic high to cause transistor 352 to enter a half-on state which would gradually drain the current from the output port to ground. This increases the buffer's time delay when the process variations, device temperatures and/or voltage levels are in their slowest state.

The usual methods to generate a bias level is to generate an analog voltage that varies with temperature and process conditions and that allows some compensation in response to those conditions. In using these prior methods it is difficult to adjust the voltage level. The solution suffers from the limitation and the compensation tends to slow down to the slowest circuit part, thereby causing a substantial degradation in the worse case speed specification in the circuit. It is also important to note that when the circuit is in its slowest condition, compensation may not be necessary and may in effect be detrimental.

In this case, if the bias voltage is fixed at an intermediate level, delay of the output buffer becomes excessively large even though the noise in the output buffer is reduced. What is needed then is a means and method of solving the problem with a bias voltage supply circuit which can adjust the bias voltage, taking process variations into consideration as well as circuit speed reaction to voltage level.

Therefore, it is an object of this invention to provide a ROM circuit which overcomes each of the above-discussed shortcomings of the prior art.

It is an object of the invention to provide an output buffer circuit which is not characterized by a high switching current and still has a fast switching speed.

BRIEF SUMMARY OF THE INVENTION

The invention is an improvement in a memory circuit having a memory array comprising a plurality of addressable memory cells including a bias circuit for generating a bias voltage for use within the memory circuit for setting of operating points of circuits therein. The improvement in the bias circuit comprises an RC delay circuit for generating a timed delay. The RC delay circuit has an input coupled to a memory circuit enable signal input. A gate delay circuit generates a time delay based on average gate performance within the memory circuit. The gate delay circuit has an input coupled to a memory circuit enable signal input. A latched logical compare circuit is coupled to the RC delay circuit and gate delay circuit. The latched logical compare circuit compares the delayed signals from the RC delay circuit and gate delay circuit, and determines which is first in time. The latched logical compare circuit latches to a distinguishable state depending upon which of the delay signals from the RC delay circuit and gate delay circuit is first in time. A switching circuit generates a bias potential depending upon the state of the latched logical compare circuit.

The RC delay circuit is comprised of a plurality of capacitors and resistors and is substantially independent of process, temperature and voltage variations. The gate delay circuit comprises a plurality of inverters constructed to be representative of the general circuit speed within the memory circuit.

The gate delay circuit is constructed to model portions of the memory circuit whose speed of operation is affected by variations in temperature and voltage.

Among the circuits in the memory circuit is an output buffer circuit. The switching circuit provides a bias voltage to the output buffer circuit at a voltage level sufficient to reduce noise within the output buffer circuit.

The various embodiments of the invention can better be visualized and understood by turning to the following drawings wherein like elements are referenced by like numerals.

The invention and its various embodiments can now be better understood by turning to the following detailed description.

DETAILED DESCRIPTION OF THE PREFERRED EMBODIMENTS

The invention comprises a memory cell array formed by a plurality of memory cells which are divided into blocks. The memory cells are symmetrically patterned with respect to conductive lines which connect junctions between the memory cell blocks and a main bit line. The conductive lines are perpendicular to the main bit line.

The invention further includes an input buffer circuit having a threshold voltage of its initial inverter stage controlled by a driving transistor.

The invention also comprises an output buffer circuit in a ROM which includes a two-stage circuit for controlling current flowing from an output pin into the ground.

The invention comprises a sense circuit including means for adjusting loads in response to the driving signal from the memory cells.

Figure 1:
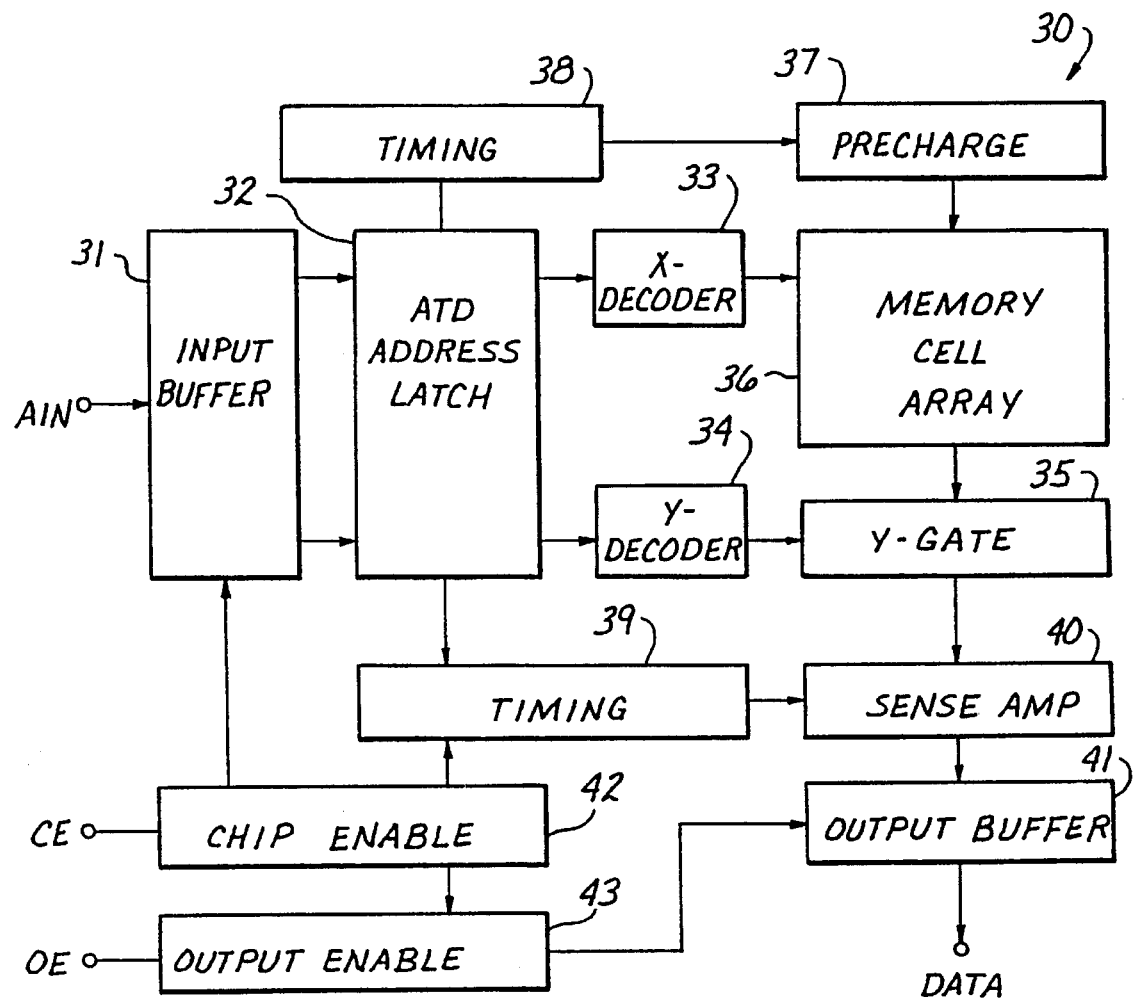
FIG. 1 is a block diagram showing a typical read only memory architecture in which the invention is embodied.

Turn now to the block diagram of FIG. 1, wherein a typical read only memory, denoted by reference numeral 30, is depicted. An address input signal, AIN, is coupled to an input buffer 31 and converted from TTL level logic to the logic levels required within memory 30. An address detection circuit and latch 32 detects the transition of the address signal and produces appropriate timing signals which are coupled to timing circuitry 38 and 39.

The address signal is coupled through ATD 32 to X decoder 33 and Y decoder 34. The bit lines of a memory cell array 36 are precharged by a precharge circuit 37 controlled by timing circuit 38. A memory cell is selectively accessed within memory array 36 by X decoder 33 and a Y gate select circuit 35. Y gate select circuit 35 in turn is controlled by Y decoder 34. The output of the accessed memory cell is coupled to sense amplifier 40. Sense amplifier 40 detects voltage levels on the precharged bit lines according to whether a 1 or a 0 is stored in the memory cell. Timing circuit 39 is coupled to and controls sense amplifier 40. The output signal from sense amplifier 40 is coupled to output buffer 41 whose output in turn is the data signal, Q and its logical complement, Q-. Throughout this specification the "31" suffixed to a signal symbol designates the logical complement of the signal. Discrete control commands, such as chip enable, CE, are coupled through chip enable circuit 42 which in turn controls input buffer 31, timing circuit 39 and an output enable circuit 43. Output enable circuit 43 is also responsive to an external control signal OE, output enable. Output enable circuit 43 is connected to and controls output buffer 41.

Figure 2:
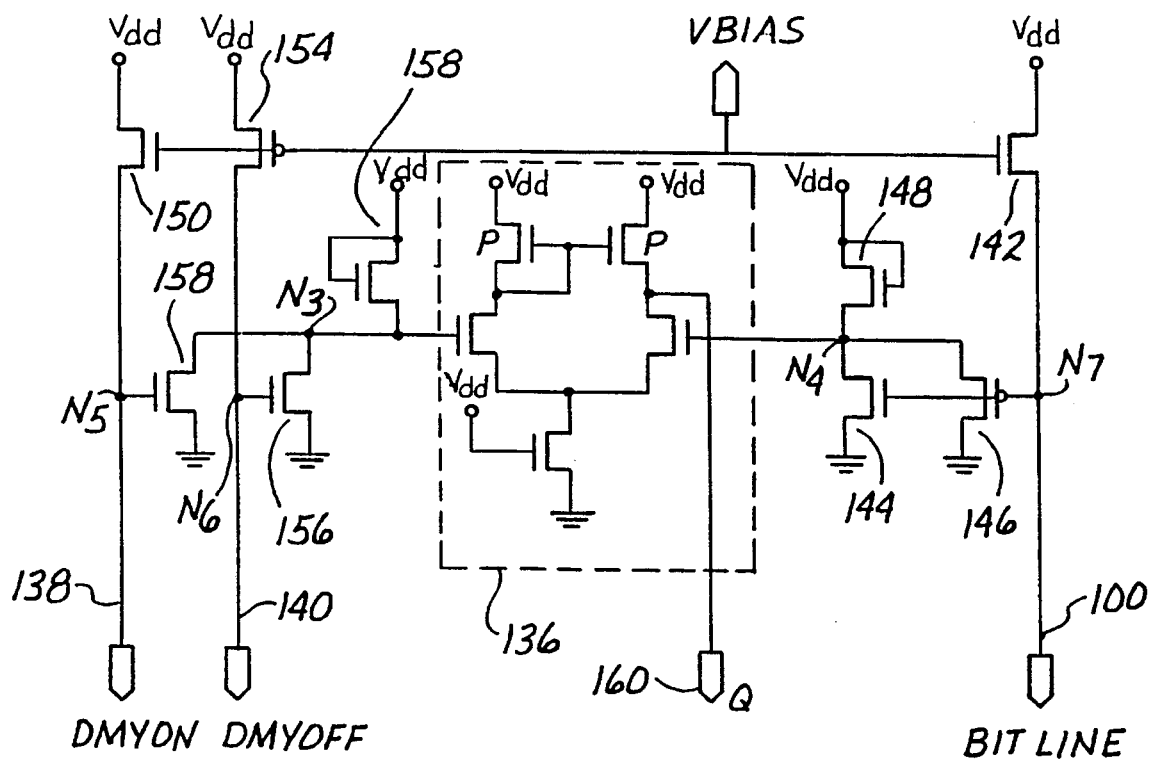
FIG. 2 is a circuit diagram of a sense amplifier incorporating the invention.

Turn now to FIG. 2 which illustrates sense amplifier 40 of FIG. 1. A differential amplifier, collectively denoted within the dotted outline of reference numeral 136 amplifies the difference between two inputs at nodes N3 and N4. The difference is the output 160, Q. A main bit line 100, for example, from memory cell array 36 of FIG. 1 is coupled with N memory cells which are turned on or off due to an application of a gate voltage used to address the memory cells. N is the number of memory cells coupled to a typical bit line within the memory array. A dummy bit line 138 corresponding to the on state and a dummy bit line 140 corresponding to the off state are shown in the left portion of the schematic of FIG. 2.

A programmed ON memory cell driven by the selected word line is placed in a position farthest from the word line generator, where the word line voltage will be at a minimum, along with a maximum number possible of OFF programmed memory cells in the selected memory bank gated by all the other deselected word lines and are connected to the dummy bit line 138 in a fashion as similar to the actual bit line. The object is to create a model of the worst ON, least leaky bit line possible. Likewise a programmed OFF memory cell driven by the selected word line is placed in a position nearest the word line generator, where the word line voltage will be at a maximum along with the maximum number of possible ON programmed memory cells in the selected memory bank gated by all the other deselected word lines which are connected to the dummy word line 140 in a fashion similar to the actual bit line. The object is to create a model of the most leaky OFF bit line possible.

Main bit line 100 which is pulled up through NMOS transistor 142 is connected with the gates of two NMOS transistors 144 and 146. Transistors 144 and 146 are coupled in parallel between node N4 and ground. Node N4 is pulled up through NMOS transistor 148. Dummy bit line 138 is pulled up through NMOS transistor 150. Dummy bit line 138 is also connected to the gate of NMOS transistor 152. NMOS transistor 152 is connected between node N3 and ground. Dummy bit line 140 is pulled up through NMOS transistor 154. Dummy bit line 140 is also coupled to the gate of NMOS transistor 156 which in turn is coupled between node N3 and ground. The voltage node N3 is pulled up through pull-up transistor 158. Thus the voltage node N3 is determined according to the operation of transistors 152, 156 and 158 while the voltage on node N4 is similarly determined by the operation of transistors 144, 146 and 148. A bias voltage, VBIAS, is applied to the gates of pull-up transistors 150, 154 and 142.

The operation of the sense amplifier of FIG. 2 is as follows. Assume that the voltage on dummy bit line 138, dummy bit line 140 and bit line 100 is in excess of the threshold values of transistors 152, 156 with respect to dummy bit lines 138 and 140 and in excess of the threshold of transistors 144 and 146 with respect to main bit line 100. Voltage at nodes N3 and N4 will be equal, higher or lower with respect to each other as follows. If the average voltage on the gates of transistors 158 and 156 is equal to the voltage applied to transistors 144 and 146 from main bit line 100, then the voltage on nodes N3 and N4 will be equal. If the average voltage on the gates of transistors 158 and 156 is greater than the voltage applied to the gates of transistors 144 and 146 from main bit line 100, then the voltage at node N4 will be greater than the voltage at node N3. If the average of the voltage at the gates of transistors 158 and 156 is less than the voltage applied to the gates of transistors 144 and 146 from main bit line 100, then the converse is true, namely, the voltage at N3 will be greater than the voltage, at N4. This relationship is achieved by appropriate relative sizing the transistors in question.

Assume now that the voltage on main bit line 100 is between an on-state voltage and off-state voltage of the selected memory cell. Assume further that the voltage of dummy bit line 140 is at the voltage off-state level while voltage on dummy bit line 138 is at on-state level. Finally, assume that the magnitude of the voltage off-state is greater than the voltage on-state. When the selected memory cell is on, the average voltage applied to the gates of transistors 152 and 156 necessarily equals the average of the voltage on and off states. Since we have assumed that the selected memory cell connected to bit line 100 is on, the voltage applied by bit line 100 to the gates of transistors 144 and 146 is less than the voltage applied at node N3. Therefore, according to the biasing of nodes N3 and N4 described above, the voltage at node N3 is less than the voltage at node N4.

Similarly, if the selected memory cell were off, then the off voltage level applied to the gates of transistors 144 and 146 would exceed the average voltage applied to the gates of transistors 152 and 156. Again from the description of the biasing of nodes N3 and N4 above, this results in the voltage of N3 being greater than the voltage at N4.

Therefore, while a constant voltage is applied to node N3, a higher or lower voltage than node N3 is applied to node N4 in response to the selected memory cells depending on whether the cell is in the off or on state. The voltage difference between nodes N3 and N4 is amplified by differential amplifier 80 whose output is provided as at sense voltage terminal 160.

Leakage current which is generated over the entire memory cell array is uniformly applied to main bit line 100 and dummy bit lines 138 and 140. Assuming then that the drop of voltage due to the leakage current occurs equally on dummy bit lines 138 and 140, the average voltage applied by lines 138 and 140 to the gates of transistors 152 and 156 also occurs at bit line 100. This effectively eliminates leakage current on the sense amplifier read-out regardless of the voltage or current on the word lines within the memory cell array, since dummy bit line 138 and 140 are positioned within the array where the word line generation voltage is at a maximum and minimum respectively.

Figure 3:
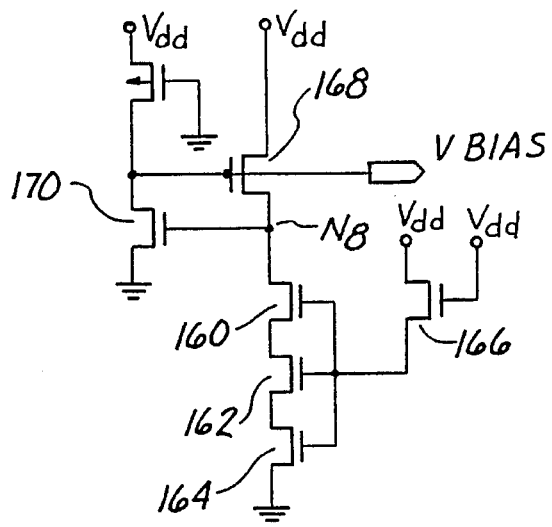
FIG. 3 is a circuit diagram for a bias circuit to generate a bias voltage utilized in the sense circuit of FIG. 2.

Turn now to the operation of a bias voltage generator depicted in the schematic FIG. 3 which generates the voltage VBIAS utilized in the sense amplifier of FIG. 2, which bias is applied to the gates of pull-up transistors 150, 154 and 142. NMOS transistors 160, 162 and 164 are coupled in series between a node N8 and ground and are sized and constituted similar to the memory cell series array seen in a bit line. A constant voltage is applied to the gates of transistors 160–164 from pull-up transistor 166. Transistors 160–164 are in series with load transistor 168 whose gate is coupled to the output of inverter 170. The input of inverter 170 is also coupled to node N8 while the output of inverter 170 is the voltage, VBIAS.

When memory current is reduced by variations in process parameters or other factors, the voltage at node N8 is increased because this variation is reflected in higher resistance of transistors 160–164, and the bias voltage is reduced, thereby stabilizing the operation of the sense amplifier of FIG. 2. Similarly, if the memory cell current is increased, the bias voltage is increased. Potentials at the gates of transistors 152, 156, 144 and 156 of FIG. 2 are therefore maintained at constant levels with respect to variations in memory cell current by applying appropriate bias to pull-up transistors 150, 154 and 142.

If the bias voltage is not controlled, no voltage difference is caused between nodes N3 and N4 when the potential on dummy bit line 138 is excessively increased by reduction of the on-state current. Therefore, a sufficient differential input cannot be applied to differential amplifier 136 with the result that speed is lowered and the noise margin is reduced. The operation of the bias circuit of FIG. 3 provides necessary bias control offset increases in the memory cell on-state current by adjusting bias voltage in response to a current model of the bit lines, namely the similar construction and sizing of transistors 160, 162 and 164 to the memory cell sets.

Figure 4:
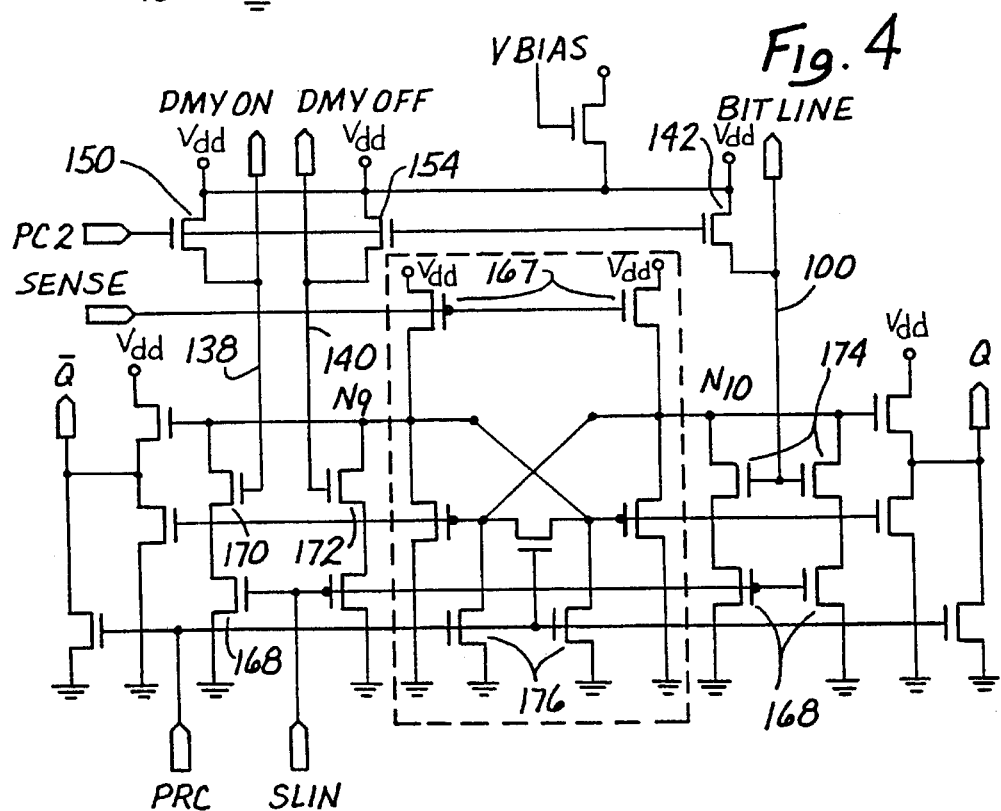
FIG. 4 is a schematic diagram of another embodiment of the sense circuit incorporating the invention.
Figure 5:
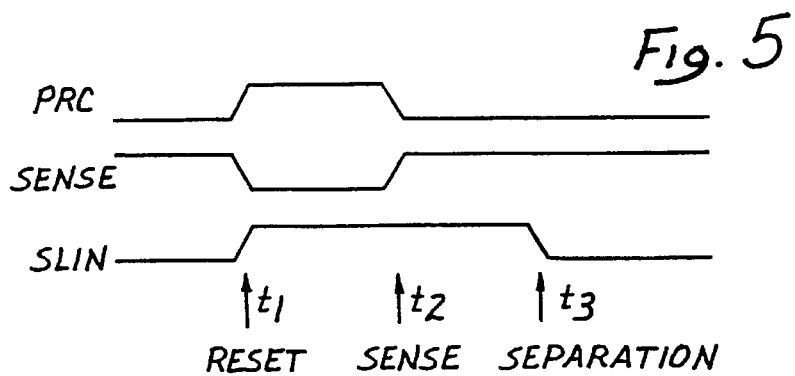
FIG. 5 is a timing diagram of the sense circuit illustrated in FIG. 4.

The operation of the latch of FIG. 4 is depicted in the timing diagram of FIG. 5. Latch 172 is reset at time T1 when PRC goes active and SENSE goes logically low. Data input to the latch is enabled between times T2 and T3. The latch is disconnected from the memory cells at time T3, thereby rendering the sense amplifier of FIG. 4 insensitive to any noise which occurs outside of the T1 to T3 interval and further isolating it from the memory array outside the T1 to T3 interval.

Figure 14:
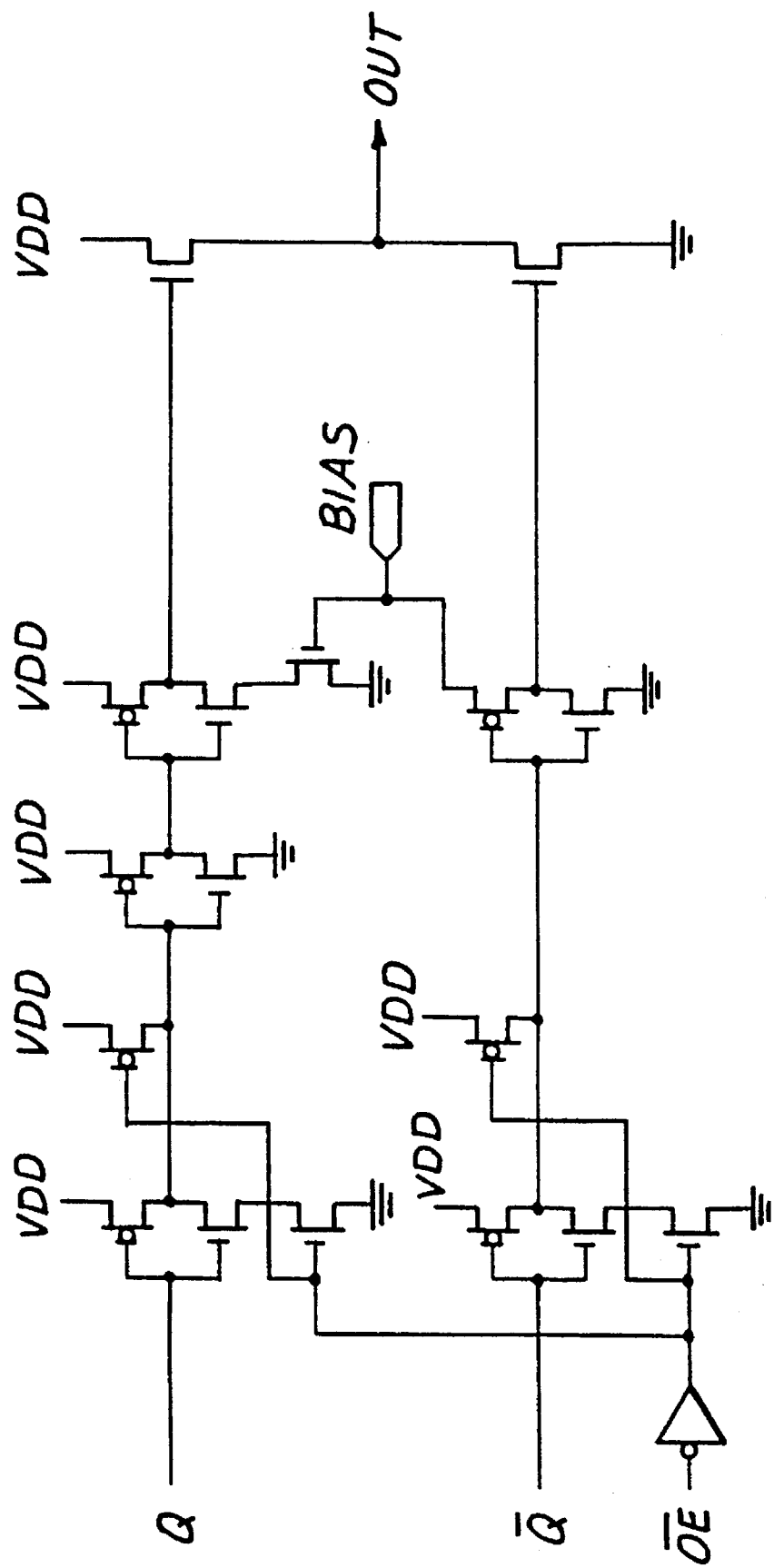
FIG. 14 is a schematic diagram of a CMOS output buffer circuit for use in combination with the bias circuit of FIG. 13.

The sense amplifier of the invention now having been described, consider improvements made in output buffer 41 of FIG. 1 as depicted in FIGS. 14 and 15. The Q and Q– signals from the sense amplifier of FIG. 4 is applied to the inputs of inverters 200 and 202. Inverters 200 and 202 are comprised of a natural load resistor and an NMOS gating resistor. Inverter 200 is coupled between VCC and ground while inverter 202 is coupled between a bias voltage, BIAS, and ground. The gates of the load transistors of inverters 200 and 202 are driven by inverters 203 coupled to the Q– and Q inputs respectively. The outputs of inverters 200 and 202 are coupled to second-stage inverters 204 and 206. The gates of the gating transistor of inverters 204 and 206 are coupled to an output enable signal OE. The outputs of inverters 204 and 206 in turn are coupled to the gates of NMOS transistors 208 and 210 of an output buffer stage coupled between the power supply and ground. The output 212 is resistively coupled to the junction between transistors 208 and 210.

Figure 6:
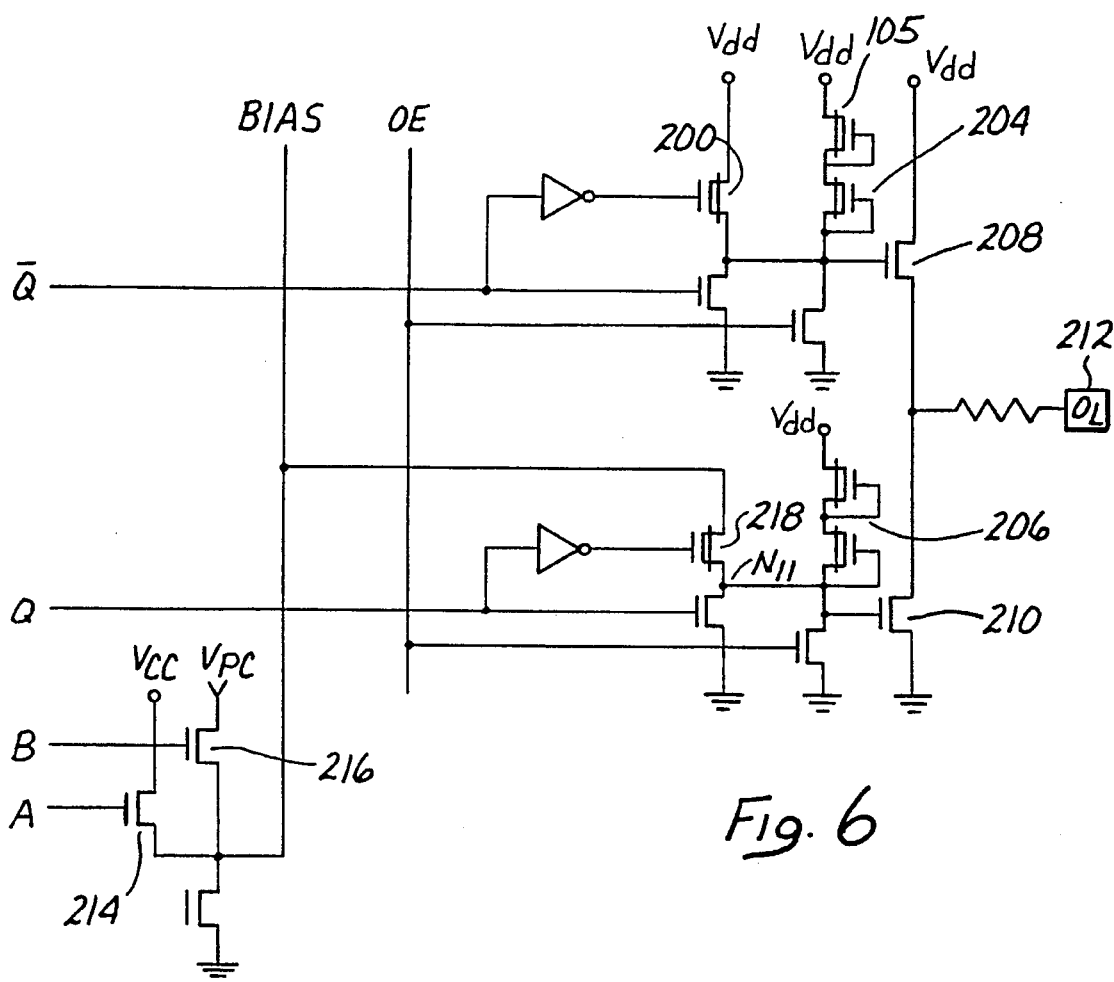
FIG. 6 is a schematic diagram showing an output buffer circuit incorporating the invention.

As shown in FIG. 6, the bias voltage, BIAS, is applied to node N11 through a natural transistor forming the load transistor of inverter 202. The line for the bias voltage, BIAS, is coupled to the supply voltage through a transistor 214 as well as through transistor 216 to a constant voltage VPC which is less than the supply voltage VCC. The gates of transistors 214 and 216 are controlled respectively by control signals A and B, which are conventionally generated timing signals from timing circuit 39 of FIG. 1. Natural transistors 217 and 218 of inverters 200 and 202 respectively have a threshold voltage of substantially zero volts.

Figure 7:
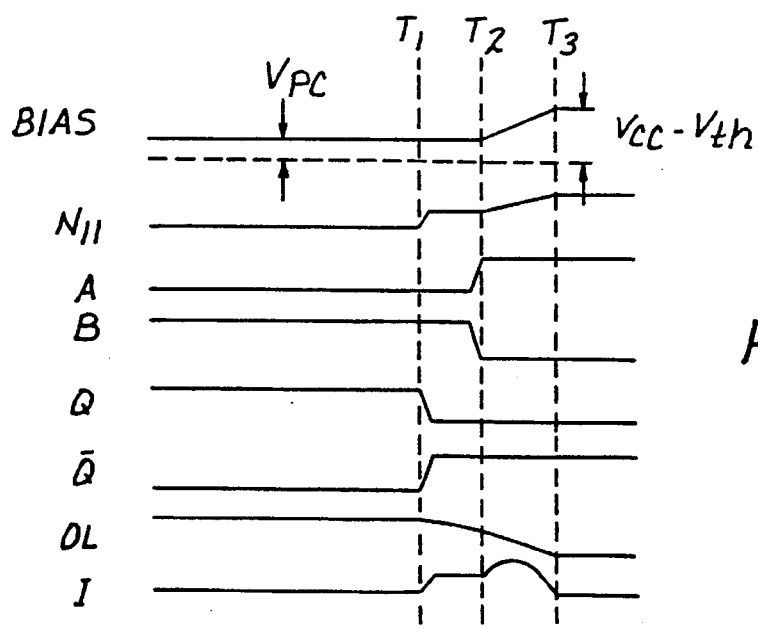
FIG. 7 is a timing diagram of the circuit of FIG. 6.

When the signal Q is converted to a low logic level from a high logic level, signals A and B according to the control scheme of the invention are changed after a time delay as best depicted in FIG. 7. The signal Q changes at time T1 while signals A and B change at time T2. The bias voltage is maintained at VPC until the signals A and B are changed. Thus the voltage at node N11 is not immediately converted to Vcc simultaneously with the transition of Q. The result is that NMOS transistor 210 of the final stage inverter is not completely turned on in the output circuit. The amount of current flowing from output pin 212 into ground is therefore small.

When the signals A and B change, the bias voltage is converted to the same level as Vcc as shown in FIG. 7 at time T3 and the node N11 is driven to a high logic level. NMOS transistor 210 of the final stage inverter 206 is then completely turned on and the current again flows from output 100 to ground.

Therefore, current flowing from output pin 212 into ground is divided into two stages by the output buffer circuit of FIG. 6. The current peak is therefore controlled to suppress instability of potential at ground, that is, the occurrence of noise signals on the ground line.

The invention is also embodied in a VLSI circuit device used to detect relative differences in circuit speed as may be caused by voltage, temperature or processing tolerances in order to provide a means of compensating for these variations when they adversely effect the circuit performance, particularly the output buffer power supply pin inductance. As will be described in greater detail in connection with FIGS. 26, a circuit is shown and described which switches the supply voltage to a bias voltage based on the signal output from a latched logical circuit. The signal from the latched logical circuit is changed, depending on which one of two signals which were input simultaneously to an RC-type delay circuit and to a gate delay circuit arrives first at a latched logical circuit.

Figure 8:
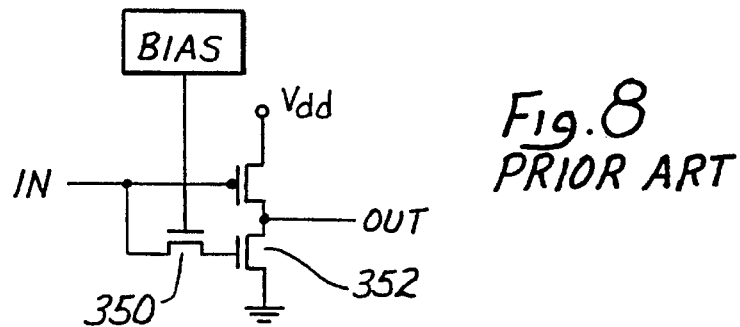
FIG. 8 is a schematic diagram of a prior art output buffer circuit.

The circuit of the invention solves the prior art problem discussed in connection with FIG. 8 by making a definite decision to directly increase the circuit speed to allow optimum performance without degradation for a slow circuit and slow conditions by providing slowing bias compensation only for fast or normal conditions within the circuit.

Figure 9:
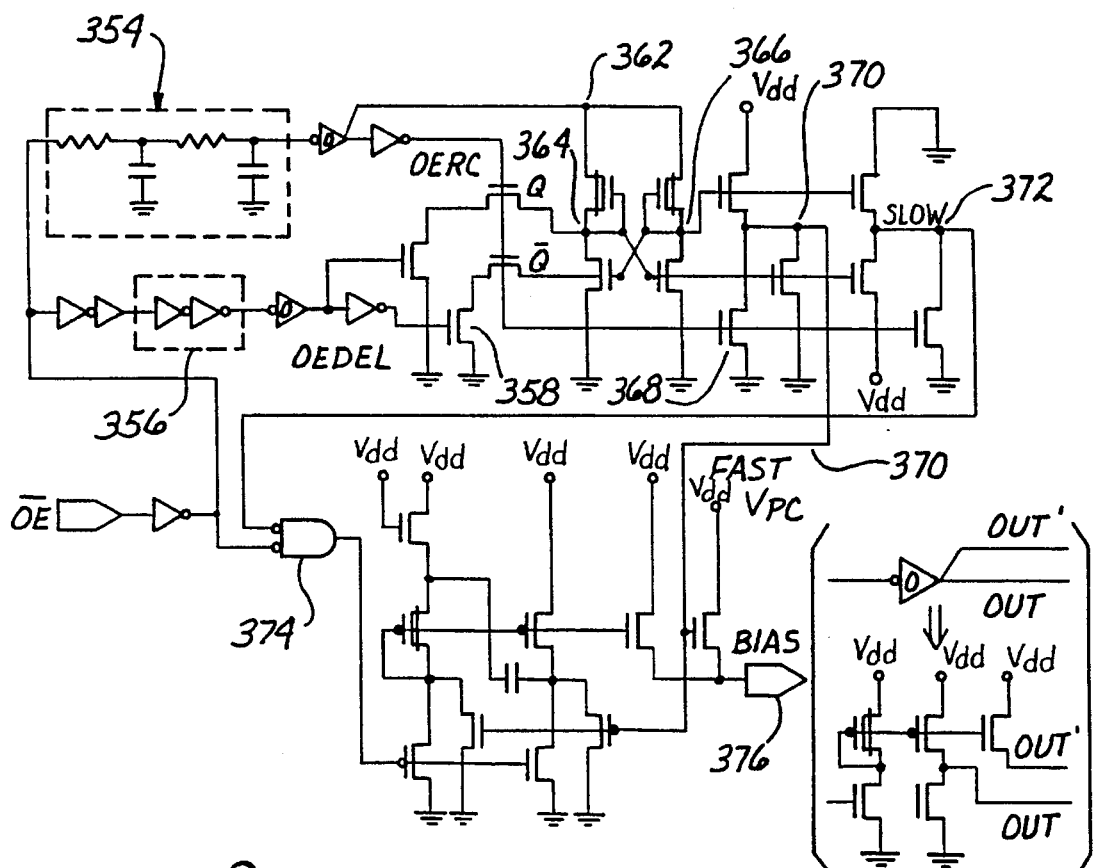
FIG. 9 is a schematic diagram of a bias circuit for an output buffer circuit incorporating the invention.

Turn now to the schematic of FIG. 9. An RC type delay circuit, generally denoted by reference numeral 354, uses resistors and capacitors to generate a time delay which is largely independent of process, temperature and voltage variations. A second time delay circuit 356 is a gated delay circuit which uses a plurality of inverters and is constructed to be fairly representative of the general speed of the LSI circuit. The output enable signal, OE-, is provided to the input of an inverter 358 whose output in turn is provided to the input of time delay circuits 354 and 356.

Figure 10:
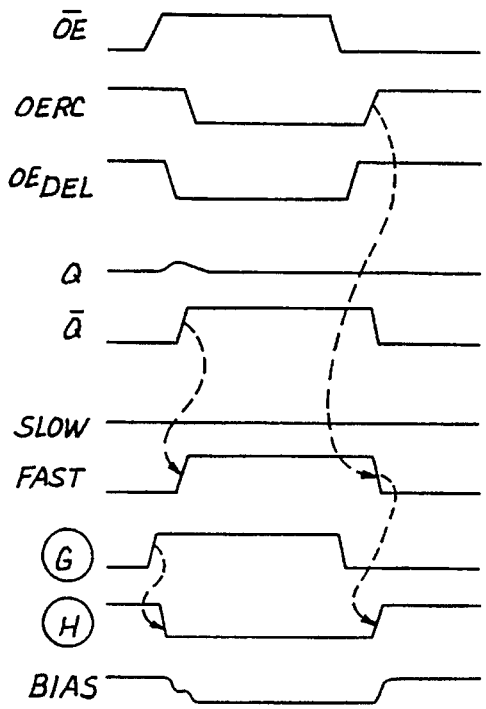
FIG. 10 is a timing diagram of the circuit of FIG. 9 when the typical circuit delay is faster than a predetermined RC delay.

Consider the operation with the delay time of circuit 356, when the inverter induced delay is smaller than the delay induced by the RC delay circuit 354. In this case, when OE– transitions from a logic low to a logic high, the signal OEDEL applied to the gate of transistor 358, changes from a logic high to a logic low before the signal OERC applied to the gates of transistors 360 changes from a logic high to a logic low. The signal at node 362 becomes high before OERC and OEDEL applied to the gates of transistors 360 and 358, respectively. As a result, the Q signal at node 364 and the Q– signal at node 366 are latched low and high, respectively. OERC is also coupled to the gates of transistors 368. Thus, even when OERC goes from high to low, the signal at node 370, the signal FAST, will go from low to high while the signal at node 372, the signal SLOW, will remain low because Q and Q– are latched at nodes 364 and 366. On the other hand, when the input to delay circuits 354 and 366 makes a transition from high to low, the output of NAND gate 374 changes from low to high. At this time the signal FAST is still at a logic low and causes the bias output 376 to momentarily enter a high-impedance state. When signal FAST transitions from low to high, the bias output reaches the precharge voltage VPC. Timing of the operation of the circuit of FIG. 9 in this instance is summarized by the timing diagram of FIG. 10.

Figure 11:
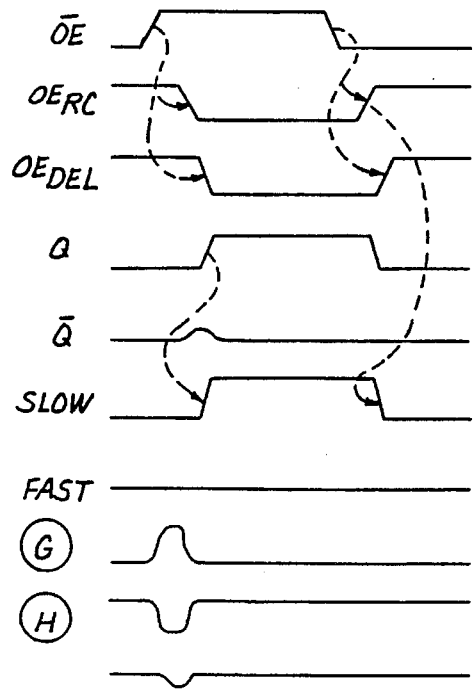
FIG. 11 is a timing diagram of the circuit of FIG. 9 when the substratetypical circuit delay is slower than a predetermined RC delay.

However, if the time delay of circuit 354 is less than the time delay of circuit 356, the following operation occurs as is summarized in connection with the timing diagram of FIG. 11. Therefore, OERC changes from high to low before OEDEL changes from high to low. The voltage at node 362 becomes high either before OERC or OEDEL. Therefore, Q is latched high and Q– latched low.

Next, even though OEDEL changes from high to low, the signal SLOW will change from low to high and FAST will remain low because Q and Q– are latched at high and low, respectively.

On the other hand, when the input to time delay circuits 354 and 356 transition from high to low, the output of NAND gate 375 changes from low to high because the signal SLOW is still at a logic low. The output biases 376 momentarily enters a high impedance state. However, SLOW switches from low to high and the output of NAND gate 374 consequently switches from high to low with the bias voltage returning to VCC.

The circuit of FIG. 9 couples the output enable signal through an RC delay circuit and gated delay circuit and compares the speed of the two. By switching the bias voltage, depending on the speed of the two signals, it is possible to construct a circuit in which the delay of the output buffer does not increase unacceptably while voltage compensation to reduce noise reduction is provided even when the gate delay is increased by process variations. This is achieved by setting the constant RC time delay of circuit 354 to a delay relative to the typical circuit delay of circuit 356, so that the slower circuits as modeled by gated delay circuit 356 and as affected by temperature and voltage conditions are determined to be slow. If this determination is made, the bias voltage is adjusted so that additional slowing of the output buffer does not occur. If it is judged that faster circuit or operating conditions are achieved, then the needed compensation of the bias voltage is supplied. As a result, the worse case speeds specifications of the circuit are not affected.

Figure 12:
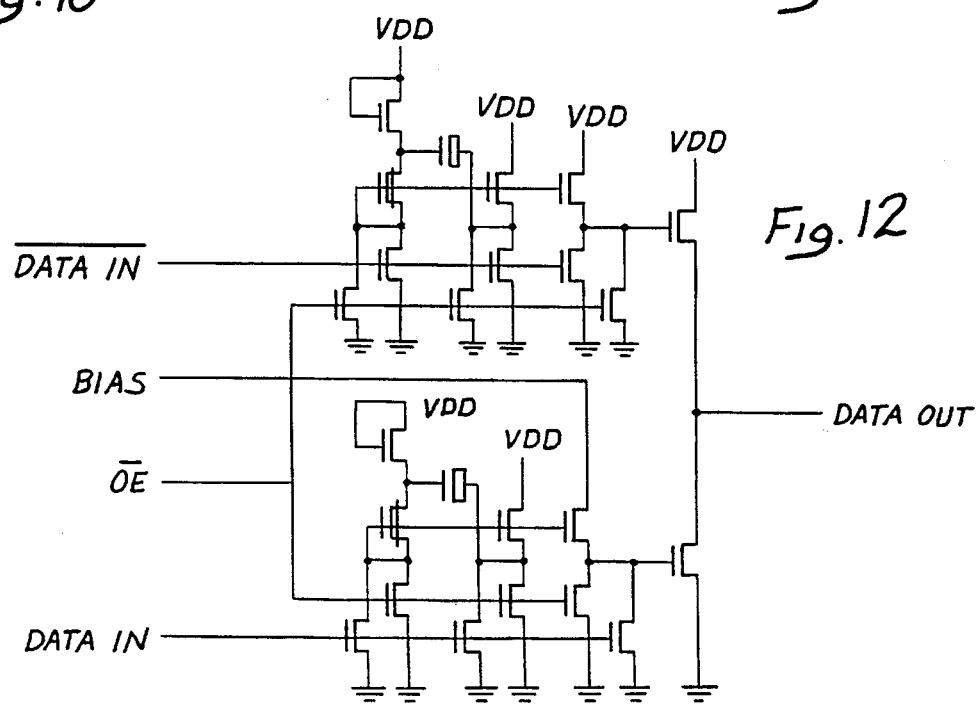
FIG. 12 is a schematic diagram of an NMOS output buffer circuit incorporating the bias signal discussed in connection with FIGS. 9–11.
Figure 13:
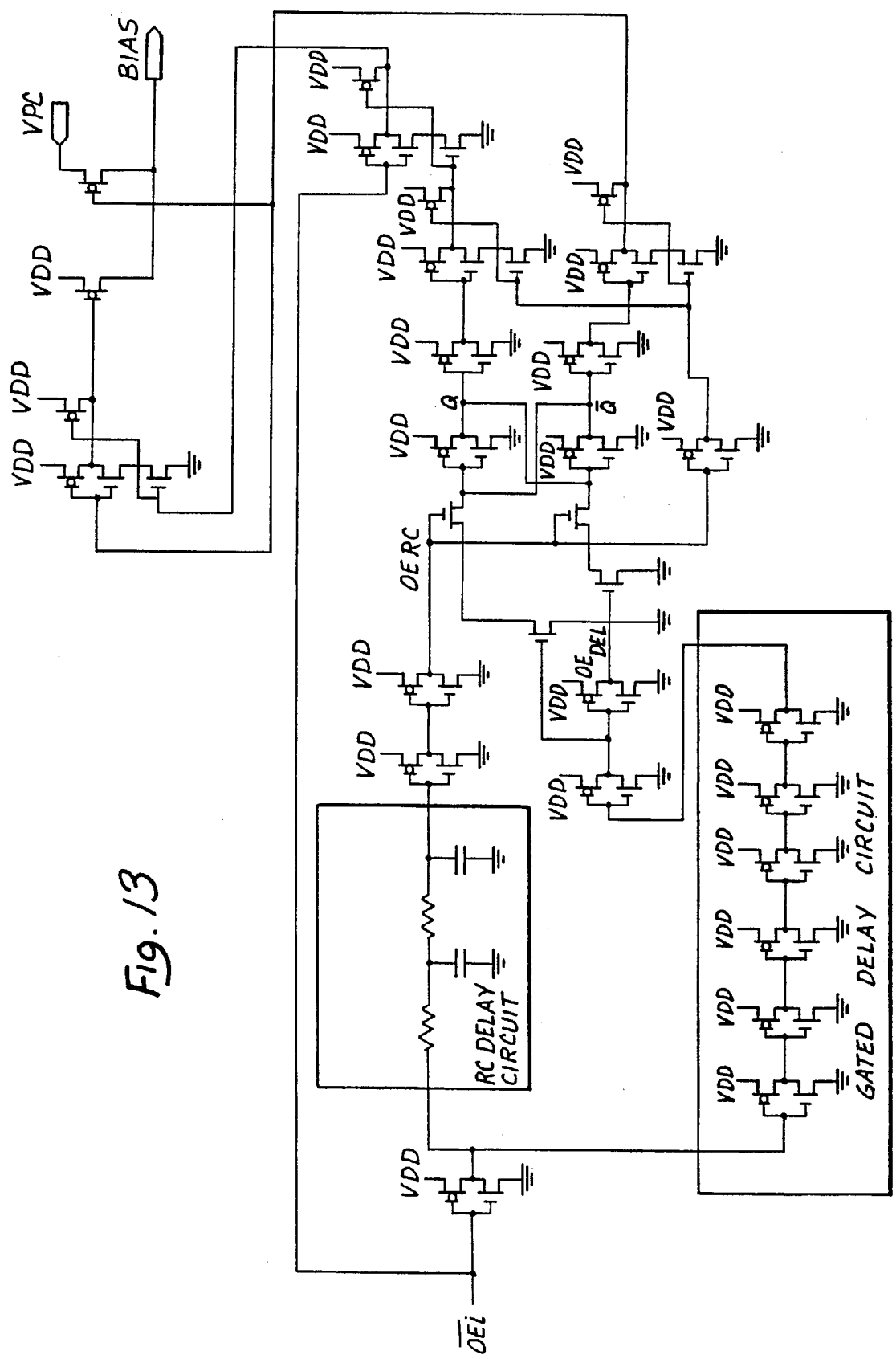
FIG. 13 is a schematic diagram of a CMOS circuit for equivalently performing the functions discussed in connection with the NMOS circuit of FIG. 9.

Additional output buffer circuits to those shown in FIG. 6 are depicted in FIGS. 29–31. FIG. 12 is a schematic of an NMOS output buffer using the bias control of the invention; FIG. 13 is a CMOS equivalent circuit to that depicted in FIG. 9, while FIG. 14 is a CMOS output buffer circuit which run by the bias signal generated by the CMOS circuit of FIG. 13.

In the prior art a back-bias generator, driven by an on-chip oscillator, is of necessity nonsynchronous with the system memory cycles. This causes occasional noise due to the asynchronous nature as well as to the continuous operation of the back-bias generator. A back-bias generator is not easily synchronized through the memory cycle as its operation is not always periodic in nature and may go for long periods without a cycle.

According to the invention, the back-bias generator is inhibited from causing a pumping action during critical memory cycles by temporarily interrupting the oscillator feedback during the memory cycles while allowing the back-bias generator to operate at all other times.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. In a VLSI circuit having a bias circuit for generating a bias voltage for use within said circuit for setting of an operating point of a plurality of subcircuits included within said VLSI circuit, an improvement in said bias circuit comprising:

RC delay means for generating a time delay signal, said RC delay means having an input coupled to a circuit enable signal, said RC delay means generating said time delay signal in response to said circuit enable signal;

gate delay means for generating a time delay signal based on average gate performance within said circuit, said gate delay means having an input coupled to said circuit enable signal, said gate delay means generating said time delay signal in response to said circuit enable signal;

latched logical compare means coupled to said RC delay means and gate delay means, said latched logical compare means for comparing said time delay signals from said RC delay means and gate delay means and determining which occurs first in time, said latched logical compare means latching to a distinguishable state depending upon which of said time delay signals from said RC delay means and gate delay means occurs first in time; and switching means for generating said bias voltage depending upon said state of said latched logical compare means.

2. The improvement of claim 1 wherein said circuit enable signal is provided simultaneously to said RC delay means and gate delay means.

3. The improvement of claim 1 wherein said plurality of subcircuits have a generally characterized circuit speed and wherein said RC delay means is comprised of a plurality of capacitors and resistors and is substantially independent of process, temperature and voltage variations, and wherein said gate delay means comprises a plurality of inverters constructed to be representative of said circuit speed of said plurality of subcircuits.

4. The improvement of claim 1 wherein said gate delay means is constructed to model said plurality of subcircuits whose circuit speed is affected by variations in temperature and voltage.

5. The improvement of claim 4 wherein said circuit includes an output buffer circuit and wherein said switching means provides said bias voltage to said output buffer circuit at a voltage level sufficient to reduce noise within said output buffer circuit.

6. The improvement of claim 1 wherein said RC delay means, gate delay means, latched logical compare means and switching means are implemented in NMOS circuitry.

7. The improvement of claim 1 wherein said RC delay means, gate delay means, latched logical compare means and switching means are implemented in CMOS circuitry.

8. The improvement of claim 5 wherein RC delay means, gate delay means, latched logical compare means and switching means are implemented in CMOS circuitry including said output buffer circuit.

9. In a circuit having a bias circuit for generating a bias voltage for use within said circuit for setting of operating points of subcircuits therein, a method in said bias circuit comprising the steps of:

generating a first RC time delay signal, said first RC time delay signal having a beginning and an end, and being generated in response to a circuit enable signal;

generating a second time delay signal based on average gate performance within said circuit signal, said second time delay signal having a beginning and an end, and being generated in response to said circuit enable signal;

comparing said first and second time delay signals to determine which signal has its end occur first;

latching a distinguishable state signal in a circuit depending upon which of said first and second time delay signals has its end occur first; and generating a bias voltage depending upon said distinguishable state signal.

* * * * *